(12) United States Patent
Seike et al.

(10) Patent No.: US 7,244,993 B2
(45) Date of Patent: Jul. 17, 2007

(54) DRIVING CIRCUIT

(75) Inventors: Mamoru Seike, Takatsuki (JP); Yukihiro Inoue, Neyagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 25 days.

(21) Appl. No.: 11/255,883

(22) Filed: Oct. 24, 2005

(65) Prior Publication Data

US 2006/0102981 A1 May 18, 2006

(30) Foreign Application Priority Data

Nov. 12, 2004 (JP) ............... 2004-328301

(51) Int. Cl.
*H01L 23/62* (2006.01)
(52) U.S. Cl. .............. 257/355; 257/173; 257/368; 257/369; 257/370; 257/500; 257/502
(58) Field of Classification Search ................ None
See application file for complete search history.

(56) References Cited

U.S. PATENT DOCUMENTS

| 5,903,032 | A | * | 5/1999 | Duvvury ............... 257/356 |
| 5,912,494 | A | | 6/1999 | Yu |
| 6,066,879 | A | | 5/2000 | Lee et al. |
| 6,459,127 | B1 | | 10/2002 | Lee et al. |
| 6,541,824 | B2 | | 4/2003 | Lee et al. |
| 6,690,067 | B2 | | 2/2004 | Ker et al. |
| 7,071,528 | B2 | * | 7/2006 | Ker et al. ............... 257/492 |

* cited by examiner

*Primary Examiner*—Evan Pert
*Assistant Examiner*—Tan Tran
(74) *Attorney, Agent, or Firm*—Steptoe & Johnson LLP

(57) ABSTRACT

A driving circuit and a data-line driver is provided which are capable of improving the tolerance to noise between adjacent terminals by using a conventional CMOS process while keeping the chip size small, because a high-density N-diffusion layer (116) is provided in an isolation region (115) to minimize a collector current of a parasitic NPN transistor (102).

2 Claims, 13 Drawing Sheets

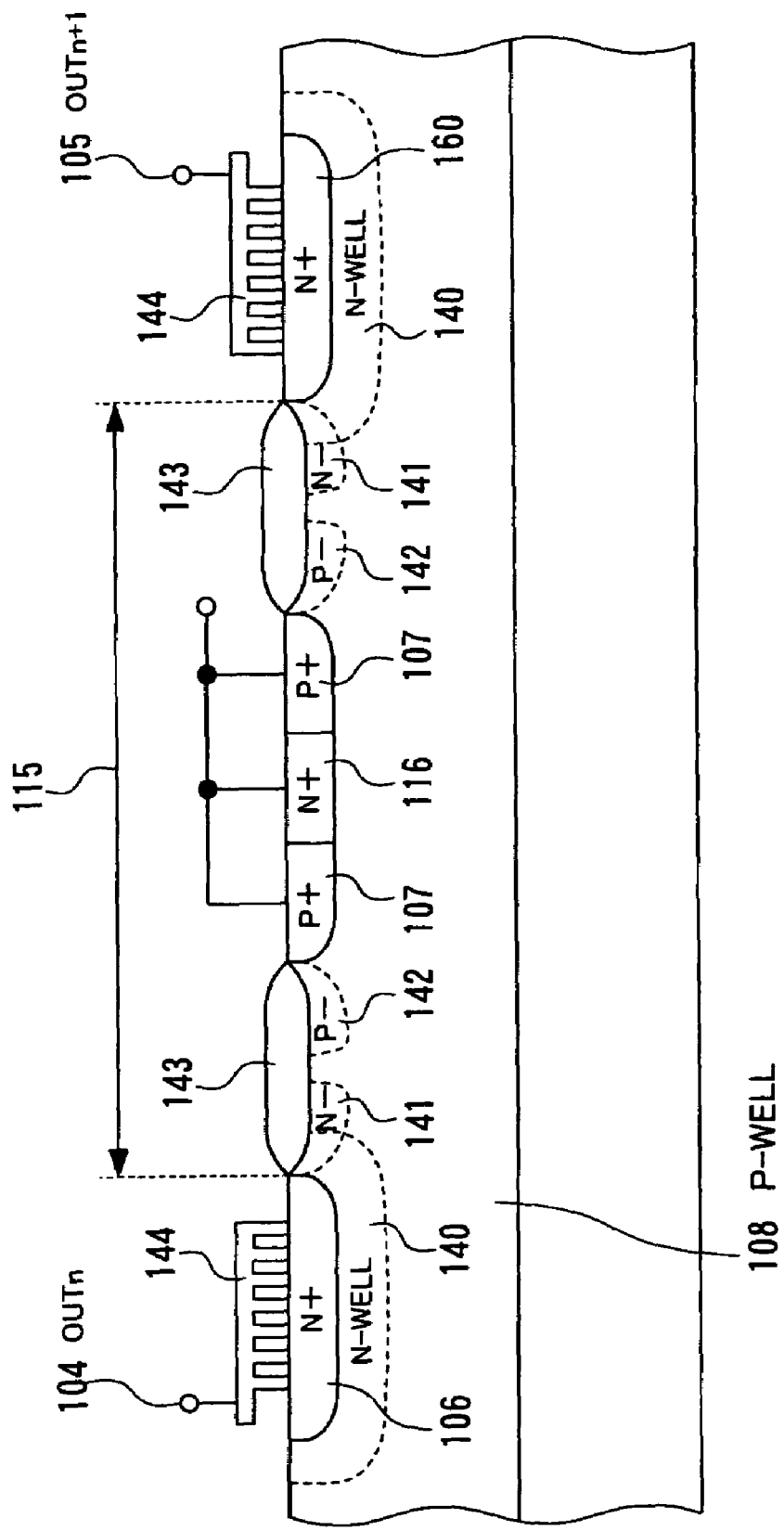

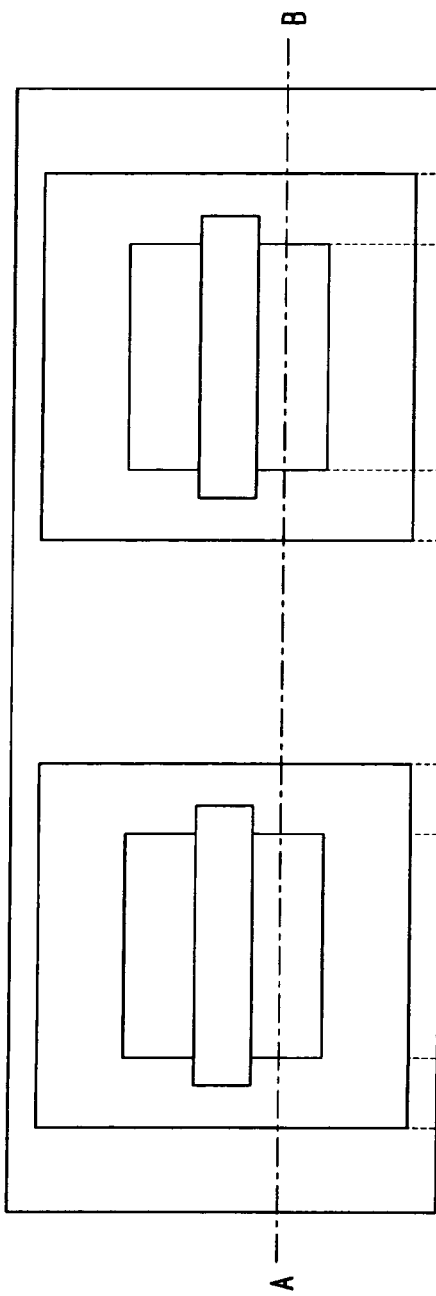
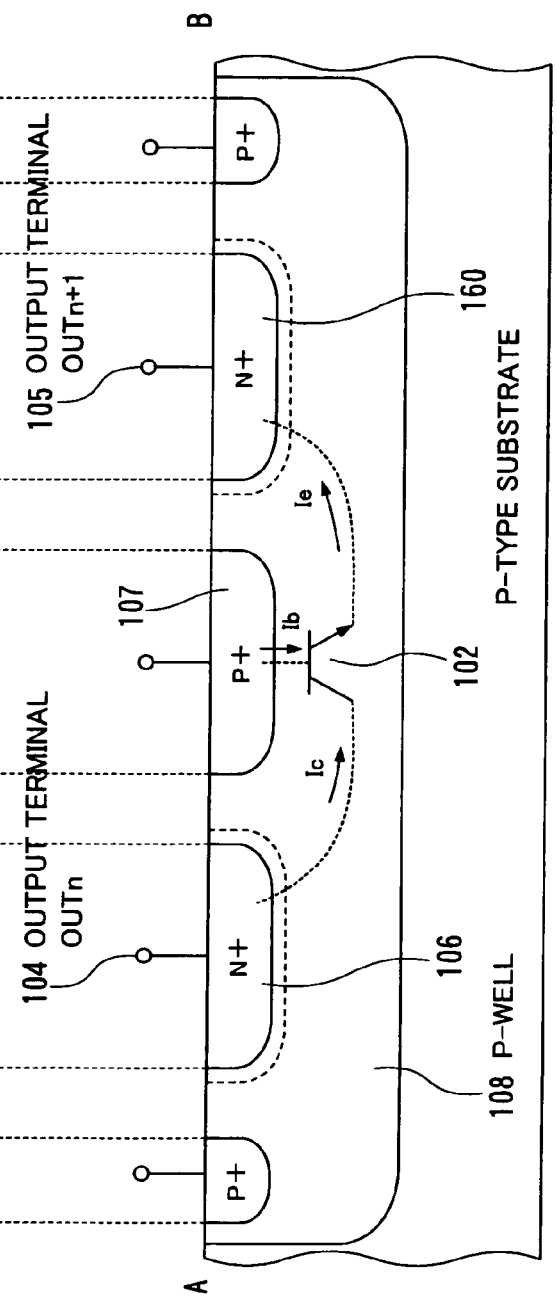
FIG. 14A PRIOR ART
FIG. 14B PRIOR ART

DRIVING CIRCUIT

FIELD OF THE INVENTION

The present invention relates to a driving circuit having multiple output buffers, and a data-line driver including the driving circuit and, in particular, to a driving circuit and a data-line driver used for driving a display panel, such as a plasma display panel, that displays images with high-voltage driving signals.

BACKGROUND OF THE INVENTION

Plasma display panels (hereinafter referred to as PDPs) have come to attention as thin, high-resolution display devices in recent years. A PDP has a number of discharge cells formed by data electrodes and sustain and scan electrodes that are arranged in a matrix. The discharge of a discharge cell is controlled by a data-electrode line and a scan-electrode and sustain-electrode lines which cross the data-electrode line at right angles. A desired image is displayed by turning on and off the discharge light emission of the discharge cells.

To drive such a PDP, semiconductor circuit devices are used which include a level shifter converting digital RGB color image signal into a high voltage capable of driving the PDP.

Such a conventional semiconductor circuit device will be described with reference to drawings.

FIG. 10 is a schematic diagram of a typical plasma display panel; FIG. 11 is a block diagram of a conventional data-line driver for driving a PDP; FIG. 12 is a schematic circuit diagram of a conventional driving circuit; FIG. 13 is a driving waveform chart of the conventional driving circuit; FIG. 14A is a schematic diagram showing a structure of a conventional PDP-driving circuit; FIG. 14B is a schematic cross-section diagram of the conventional PDP-driving circuit, showing the cross-section taken along line A-B in FIG. 14A; and FIG. 15 is a current characteristic diagram of an NPN parasitic bipolar transistor in the conventional driving circuit.

As shown in FIG. 10, the display panel (PDP) 900 is driven by multiple scan-line drivers 902 connected to multiple scan-electrode lines 901 and multiple display-data-line drivers 904 connected to multiple display-data-electrode lines 903. In the PDP that provides color display, each display-data-electrode line has three color electrodes using phosphors of three different colors, R (red), G (green), and B (blue), and the display-data-electrode lines are driven individually to achieve color display.

Image data inputted through a data input terminal is serially provided to a shift register 905, as shown in FIG. 11. The serial data received by the shift register 905 is converted into parallel data by the shift register 905 and then held in a latch circuit 906. The parallel data held in the latch circuit 906 undergoes voltage transduction in a level shifting circuit 907 and the level-shifted data is outputted selectively from driving output terminals O1-Om through a driving circuit 908 as a ground potential (GND) or a power-supply potential (VCC) and is applied to the display-data electrodes 903.

FIG. 12 shows a portion of the driving circuit 908, which is formed as a multi-output driver in which a number of push-pull circuits are provided adjacently. Here, an output terminal On and another output terminal On+1 are adjacent driving output terminals and a driving-power-supply terminal 103 and a ground terminal 130 are provided for each of the output terminals On and On+1. In the configuration in which multiple driving output terminals are provided adjacently in this way, superimposed on an output from an output terminal is a self-noise associated with a change in an output from an output driving terminal adjacent to the terminal or an external noise from the panel, as shown in FIG. 13.

A high-density N-diffusion layer 106 and an adjacent high-density N-diffusion layer 160 of a transistor that implement an output buffer are formed on a P-well 108 the potential of which is fixed to the ground potential (GND). Thus, an NPN parasitic bipolar transistor 102 is formed between an output terminal OUTn 104 and its adjacent output terminal OUTn+1 105, in the path from the high-density N-diffusion layer 106 coupled to the output terminal OUTn 104, the P-well 108 coupled to the GND, to the N-diffusion layer 160 coupled to the output terminal OUTn+1 105.

If self-noise or external noise generates a potential difference greater than or equal to the built-in voltage between the N-diffusion layer 160 coupled to the output terminal OUTn+1 105 and the P-well 108 while the output terminal OUTn 104 is in the "power-supply potential (VCC)" output state and the output terminal OUTn+1 105 is in the "ground potential (GND)" output state, the NPN parasitic bipolar transistor formed between the adjacent output terminals turns on.

As a result, an emitter current Ie flows from the P-well 108 to OUTn+1 105 (the N-diffusion layer coupled to this terminal is hereinafter referred to as the emitter) and a base current Ib flows from the ground terminal 130 to the P-well 108, which causes a collector current Ic to flow from the output terminal OUTn 104 (the N-diffusion layer coupled to this terminal is hereinafter referred to as the collector) to the P-well 108 (herein after referred to as the base). If the collector current Ic flowing through the collector which is biased to a high potential exceeds a permissible current value limit, thermal destruction of the collector is caused, which results in a malfunction.

The current characteristics of an NPN parasitic bipolar transistor are determined by a physical design, diffusion density, and the voltage between the collector and the emitter, as shown in FIG. 15; the higher the driving-power-supply voltage (VCC) or the greater the collector current, the higher the electric field applied to the junction region of the collector and therefore the more likely it is that thermal destruction will occur. On the other hand, because the collector voltage is determined by the panel driving voltage, the tolerance against malfunctions and destruction can be improved by minimizing the collector current without lowering the driving-power-supply voltage.

To address the above-described problem, other driving circuits provide a sufficient distance between adjacent transistors or use an SOI (Silicon Oxide Insulated) process that insulates transistors with a silicon oxide film.

DISCLOSURE OF THE INVENTION

However, these conventional driving circuits have the problem of increased chip sizes due to an increased distance between adjacent transistors or the problem of increased costs due to a special process required for forming a structure for preventing formation of parasitic transistors.

An object of the present invention is to provide a driving circuit and data-line driver that solve these problems with the conventional driving circuits and are capable of improving tolerance to noise between adjacent terminals by using a conventional CMOS process while keeping the chip size small.

To achieve the object of the present invention, there is provided as a preferred embodiment a driving circuit including a plurality of output terminals, comprising a semiconductor substrate having a first conduction type, a first well having the first conduction type formed in the semiconductor substrate, a first diffusion layer having a second conduction type formed in the first well, the first diffusion layer related to a first output terminal of the plurality of output terminals, a second diffusion layer having the second conduction type formed in the first well, the second diffusion layer related to a second output terminal of the plurality of output terminals, and a third diffusion layer formed in the first well between the first diffusion layer and the second diffusion layer, the third diffusion layer including a fourth diffusion layer having the first conduction type, a fifth diffusion layer having the first conduction type and a sixth diffusion layer having the second conduction type formed between the fourth diffusion layer and the fifth diffusion layer, wherein a voltage applied to the sixth diffusion layer is greater than a voltage applied to the first well.

According to a preferred embodiment, there is also provided a driving circuit including a plurality of output terminals, comprising a semiconductor substrate having a first conduction type, a first well having the first conduction type formed in the semiconductor substrate, a first diffusion layer having a second conduction type formed in the first well, the first diffusion layer related to a first output terminal of the plurality of output terminals, a second diffusion layer having the second conduction type formed in the first well, the second diffusion layer related to a second output terminal of the plurality of output terminals, and a third diffusion layer formed in the first well between the first diffusion layer and the second diffusion layer, the third diffusion layer having the first conduction type, wherein the first diffusion layer includes a fourth diffusion layer opposed to the second diffusion layer and having a lower density than at least part of the first diffusion layer, and the second diffusion layer includes a fifth diffusion layer opposed to the first diffusion layer and having a lower density than at least part of the second diffusion layer.

According to a preferred embodiment, there is also provided a driving circuit including a plurality of output terminals, comprising a semiconductor substrate having a first conduction type, a first well having a second conduction type formed in the semiconductor substrate, a second well having the second conduction type formed in the semiconductor substrate, a first diffusion layer having the first conduction type formed in the first well, the first diffusion layer related to a first output terminal of the plurality of output terminals, a second diffusion layer having the second conduction type formed in the first well, the second diffusion layer formed between the first diffusion layer and the second well, a third diffusion layer having the first conduction type formed in the second well, the second diffusion layer related to a second output terminal of the plurality of output terminals, and a fourth diffusion layer having the second conduction type formed in the second well, the fourth diffusion layer formed between the second diffusion layer and the first well.

According to a preferred embodiment, there is also provided a driving circuit further comprising a fifth diffusion layer having the first conduction type formed in the semiconductor substrate between the first well and the second well.

According to a preferred embodiment, there is also provided a driving circuit including a plurality of output terminals, comprising a semiconductor substrate having a first conduction type, a first well having the first conduction type formed in the semiconductor substrate, a second well having the first conduction type formed in the semiconductor substrate, a first diffusion layer having a second conduction type formed in the first well, the first diffusion layer related to a first output terminal of the plurality of output terminals, a second diffusion layer having the first conduction type formed in the first well, the second diffusion layer formed between the first diffusion layer and the second well, a third diffusion layer having the second conduction type formed in the second well, the second diffusion layer related to a second output terminal of the plurality of output terminals, and a fourth diffusion layer having the first conduction type formed in the second well, the fourth diffusion layer formed between the second diffusion layer and the first well.

According to a preferred embodiment, there is also provided a driving circuit further comprising a third well having the second conduction type formed in the semiconductor substrate between the first well and the second well, wherein the third well connects to both the first well and the second well.

BRIEF DESCRIPTION OF THE DRAWINGS

FIG. 2 is a cross-sectional structure diagram illustrating an exemplary design according to the first embodiment;

FIG. 14A is a schematic diagram showing a structure of the conventional driving circuit for driving a PDP;

FIG. 14B is a schematic cross-sectional diagram of the conventional driving circuit for driving a PDP.

DESCRIPTION OF THE EMBODIMENTS

A semiconductor circuit device according to embodiments of the present invention will be described below in detail with reference to the accompanying drawings.

First Embodiment

A driving circuit according to a first embodiment of the present invention will be described with reference to FIGS. 1, 2, and 3.

Figures 1A, 1B:
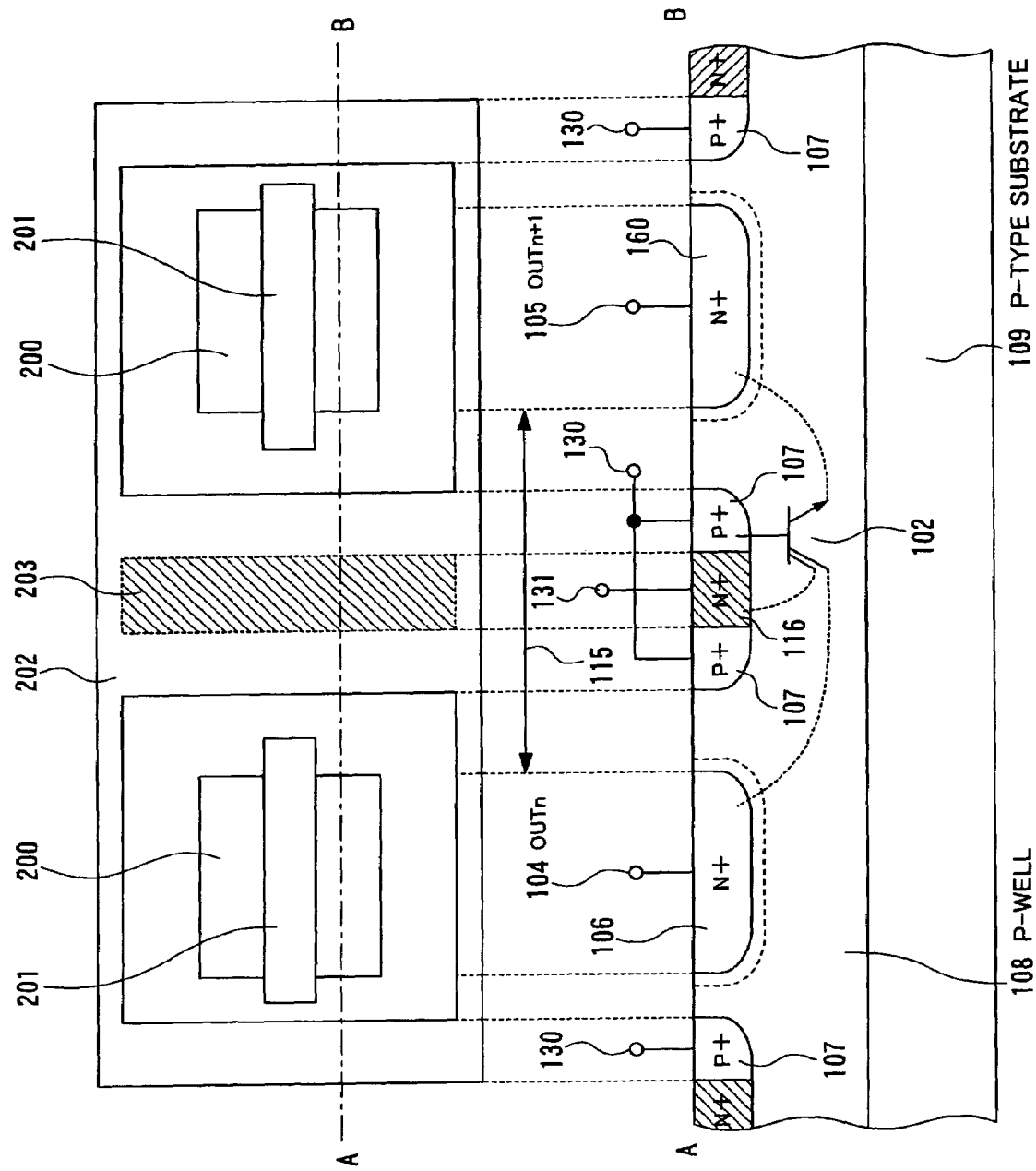
FIG. 1A is a schematic diagram showing a structure of a driving circuit for driving a PDP according to a first embodiment of the present invention.
FIG. 1B is a schematic cross-sectional diagram of the driving circuit for driving a PDP according to the first embodiment.

FIG. 1A is a schematic diagram showing a structure of a driving circuit for driving a PDP according to the first embodiment, and FIG. 1B is a schematic cross-sectional diagram of the driving circuit for driving a PDP according to the first embodiment, showing the cross-section taken along line A-B in FIG. 1A viewed from above.

A structure of the driving circuit of the first embodiment will be described first.

In FIG. 1A, reference numeral 200 denotes source-drain formation patterns of transistors constituting the driving circuit, 201 denotes a gate formation pattern, 202 denotes a P-well potential supplying diffusion layer formation pattern, and 203 denotes a collector current reducing high-density N-diffusion layer formation pattern formed in an isolation region. In FIG. 1B, reference numeral 106 denotes a high-density N-diffusion layer coupled to an output terminal OUTn, 160 denotes a high-density N-diffusion layer coupled to an output terminal OUTn+1, 107 denotes a high-density P-diffusion layer, 116 denotes a collector current reducing high-density N-diffusion layer provided in an isolation region 115 between transistors, 108 denotes a P-well, 109 denotes P-type substrate, 104 denotes the output terminal OUTn of a transistor, 105 denotes the output terminal OUTn+1 of a transistor adjacent to the transistor, 130 denotes a ground terminal, and 131 denotes a fixed-potential-supplying terminal. The collector current reducing high-density N-diffusion layer 116 is formed in the high-density P-diffusion layer 107 in an isolation region 115 and the potential of which is fixed at a value greater than or equal to the potential of the P-well 108 by the fixed-potential-supplying terminal 131.

Operation of the semiconductor circuit device will be described below.

As described in the section of "Background of the Invention", internal or external noise causes an NPN parasitic bipolar transistor formed between adjacent terminals to turn on to cause an abnormal current to flow, which results in a malfunction or destruction.

When the NPN parasitic bipolar transistor 102 operates, a current flows from the output terminal OUTn 104 to the high-density N-diffusion layer 106 to the P-well 108 to the high-density N-diffusion layer 160 to the output terminal OUTn+1 105. On the other hand, a path through which the collector current of the NPN parasitic bipolar transistor 102 is formed from the high-density N-diffusion layer 116 to the P-well 108, in addition to the path from the high-density N-diffusion layer 106 to the P-well 108, because the fixed-potential-supplying terminal 131 which fixes the potential to a value greater than or equal to the potential of the P-well 108 is connected to the collector current reducing high-density N-diffusion layer 116 in the isolation region 115. Thus, the collector current flowing between the high-density N-diffusion layer 106 and the P-well 108 is reduced and therefore the tolerance to noise between the adjacent terminals can be improved.

In this way, according to the first embodiment, the path through which the collector current of the NPN parasitic bipolar transistor flows is added by providing the collector current reducing high-density N-diffusion layer 116 in the isolation region 115 between the transistors constituting the driving circuit to fix the potential of the collector current reducing high-density N-diffusion layer 116 to a value greater than or equal to the potential of the P-well 108. Accordingly, the collector current flowing between the high-density N-diffusion layer 106 and the P-well 108 can be kept low and the tolerance against malfunctions or destruction can be improved. Thus, the tolerance to noise between adjacent terminals can be improved by using a conventional CMOS process.

An exemplary design according to the present invention will be described with reference to FIGS. 2 and 3.

Figure 3:
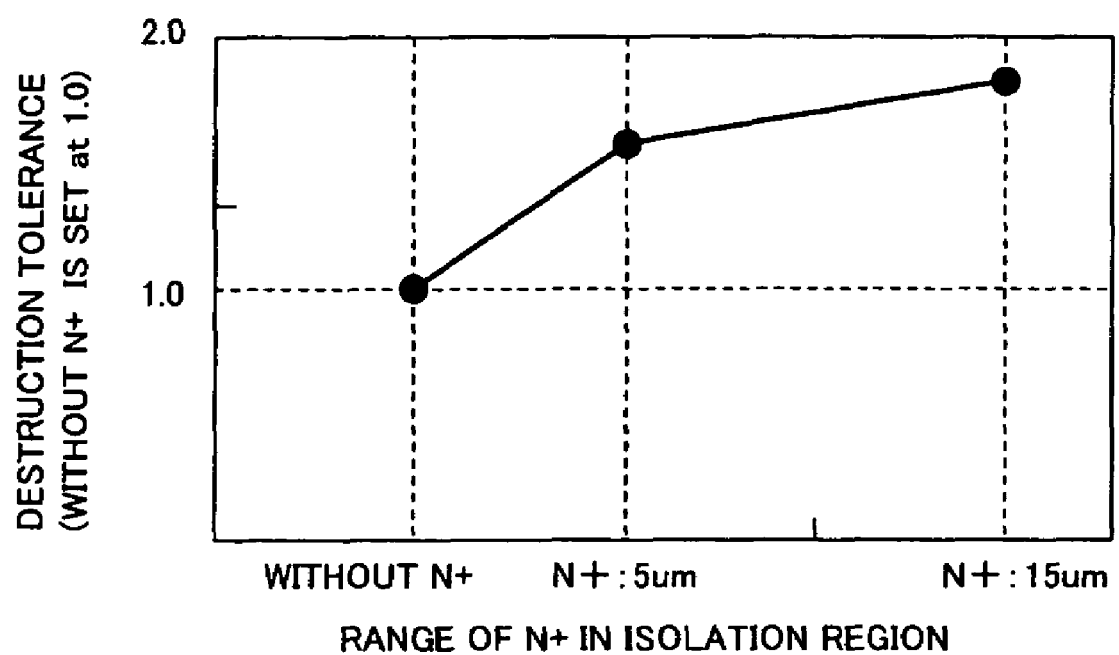
FIG. 3 is a diagram illustrating the result of evaluation of the destruction tolerance of the exemplary design of the first embodiment.

FIG. 2 is a cross-sectional structure diagram illustrating an exemplary design according to the first embodiment and FIG. 3 is a diagram for explaining the result of evaluation of the destruction tolerance of the exemplary design according to the first embodiment.

In FIG. 2, reference numeral 140 denotes an N-well for low voltage, 141 denotes an N-offset-diffusion layer, 142 denotes a P-offset-diffusion layer, 143 denotes LOCOS (Local Oxidation of Silicon), and 144 denotes an aluminum electrode for extracting an output.

A device will be described which includes a P-well 108 having a density of $2\times10^{15}$ Atoms/cm$^{-3}$, an N-well 140 for low voltage, having a density of $5.8\times10^{16}$ Atoms/cm$^{-3}$, high-density N-diffusion layers 106 and 116 having a density of $5.0\times10^{20}$ Atoms/cm$^{-3}$, a high-density P-diffusion layer 107 having a density of $5.0\times10^{20}$ Atoms/cm$^{-3}$, an N-offset-diffusion layer 141 having a density of $3.0\times10^{16}$ Atoms/cm$^{-3}$, and a P-offset-diffusion layer 142 having a density of $5.0\times10^{16}$ Atoms/cm$^{-3}$. The distance across the isolation region 115 of this device is 54 μm.

When a potential of 80 V is supplied to the output terminal OUTn 104, a voltage of 0 V is supplied to the adjacent output terminal OUTn+1 105, and a noise pulse of a negative potential is inputted to the output terminal OUTn+1 105 to increase the noise level, the current of the parasitic bipolar transistor exceeds a permissible limit, eventually resulting in a destruction.

FIG. 3 shows a comparison of destruction tolerance of designs with and without the collector current reducing high-density N-diffusion layer 116 of the present invention inserted in the isolation region. It can be seen that the tolerance against destruction is increased by inserting the collector current reducing high-density N-diffusion layer 116 which absorbs charge flowing into the base region when the NPN parasitic bipolar transistor starts to operate. As compared with the conventional design that includes a wider isolation region to improve the withstand voltage, the design of the present embodiment can keep the isolation region and therefore the chip size small while improving the noise tolerance of the transistor.

Second Embodiment

A driving circuit according to a second embodiment of the present invention will be described with reference to FIGS. 4, 5, and 6.

Figures 4A, 4B:
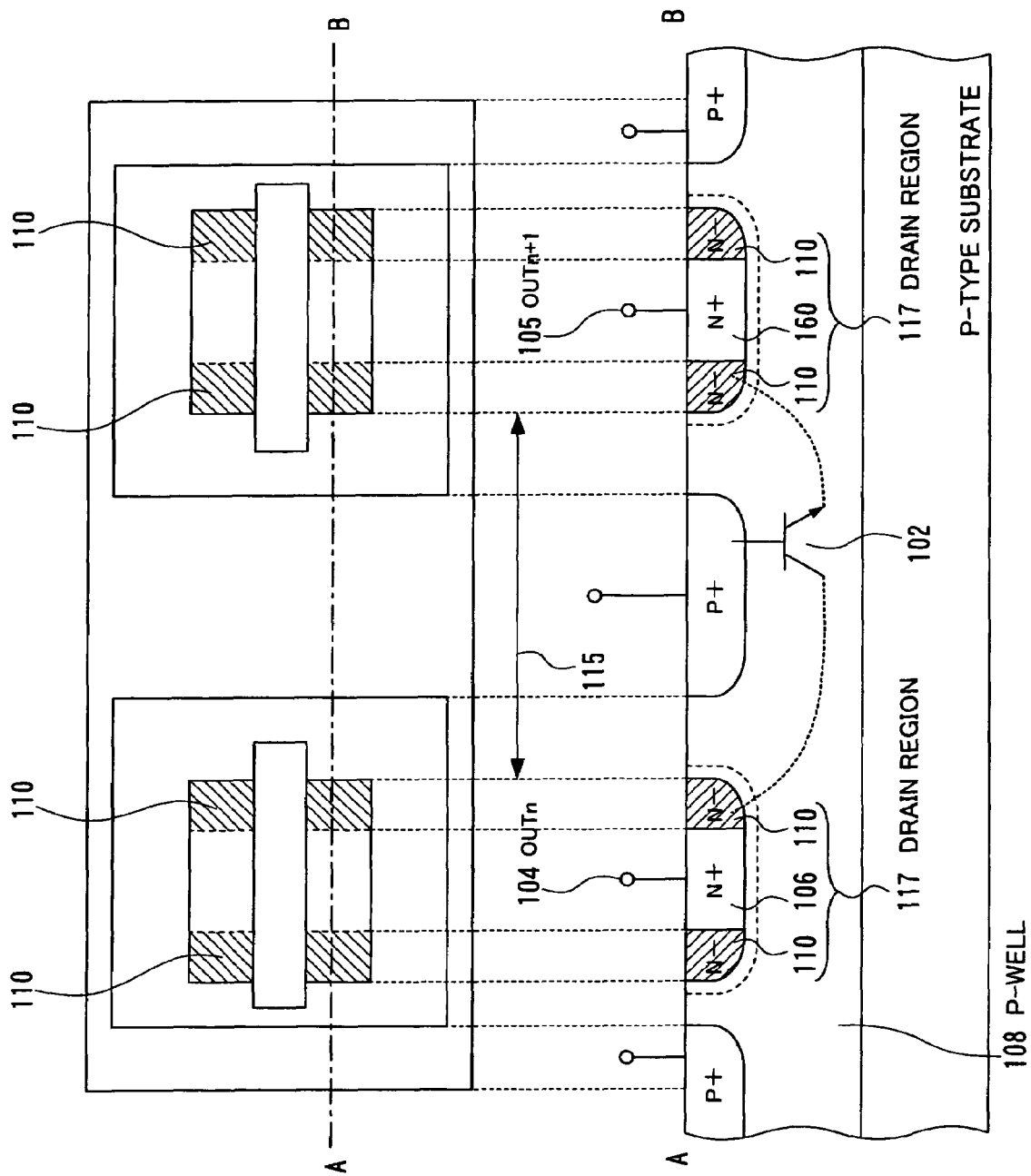
FIG. 4A is a schematic diagram showing a structure of a driving circuit for driving a PDP according to a second embodiment.
FIG. 4B is a schematic cross-sectional diagram of the driving circuit for driving a PDP according to the second embodiment.

FIG. 4A is a schematic diagram showing a structure of a driving circuit for driving a PDP according to the second embodiment, FIG. 4B is a schematic cross-sectional diagram of the driving circuit for driving a PDP according to the second embodiment, showing A-B section of the driving circuit. The driving circuit of the second embodiment differs from that of the first embodiment in that low-density N-diffusion layers 110 are provided on opposite sides of the drain region of each of adjacent transistors, instead of providing a high-density N-diffusion layer in the isolation region 115.

Operation of this semiconductor circuit device will be described below.

As described in the section of "Background of the Invention", internal or external noise causes an NPN parasitic bipolar transistor formed between adjacent terminals to turn on to cause an abnormal current to flow, which result in a malfunction or destruction.

Because the drain region 117 is provided and the low-density N-diffusion layers are provided on the opposite sides of the drain region 117, a current flow from the output terminal OUTn 104 to the high-density N-diffusion layer 106 to the low-density N-diffusion layer 110 to the P-well 108 to the low-density N-diffusion layer 110 to the high-density N-diffusion layer 160 to the output terminal OUTn+1 105 when the parasitic transistor operates.

Because the resistance of the low-density N-diffusion layer 110 in the current path is higher than the resistance of the high-density N-diffusion layer 106, the collector current flowing from the high-density N-diffusion layer 106 to the low-density N-diffusion layer 110 to the P-well 108 is reduced and therefore the tolerance to noise between the adjacent terminals can be improved.

In this way, according to the second embodiment, the resistance of the path through which the collector current flows is increased by providing the low-density N-diffusion layer 110 on the opposite sides of the drain region of each of adjacent transistors. Accordingly, the collector current of the NPN parasitic bipolar transistor can be minimized. Thus, the tolerance to noise between the adjacent terminals can be improved while keeping the chip size small by using a conventional CMOS process.

An exemplary design according to the present invention will be described in detail with reference to FIGS. 5 and 6.

Figure 5:
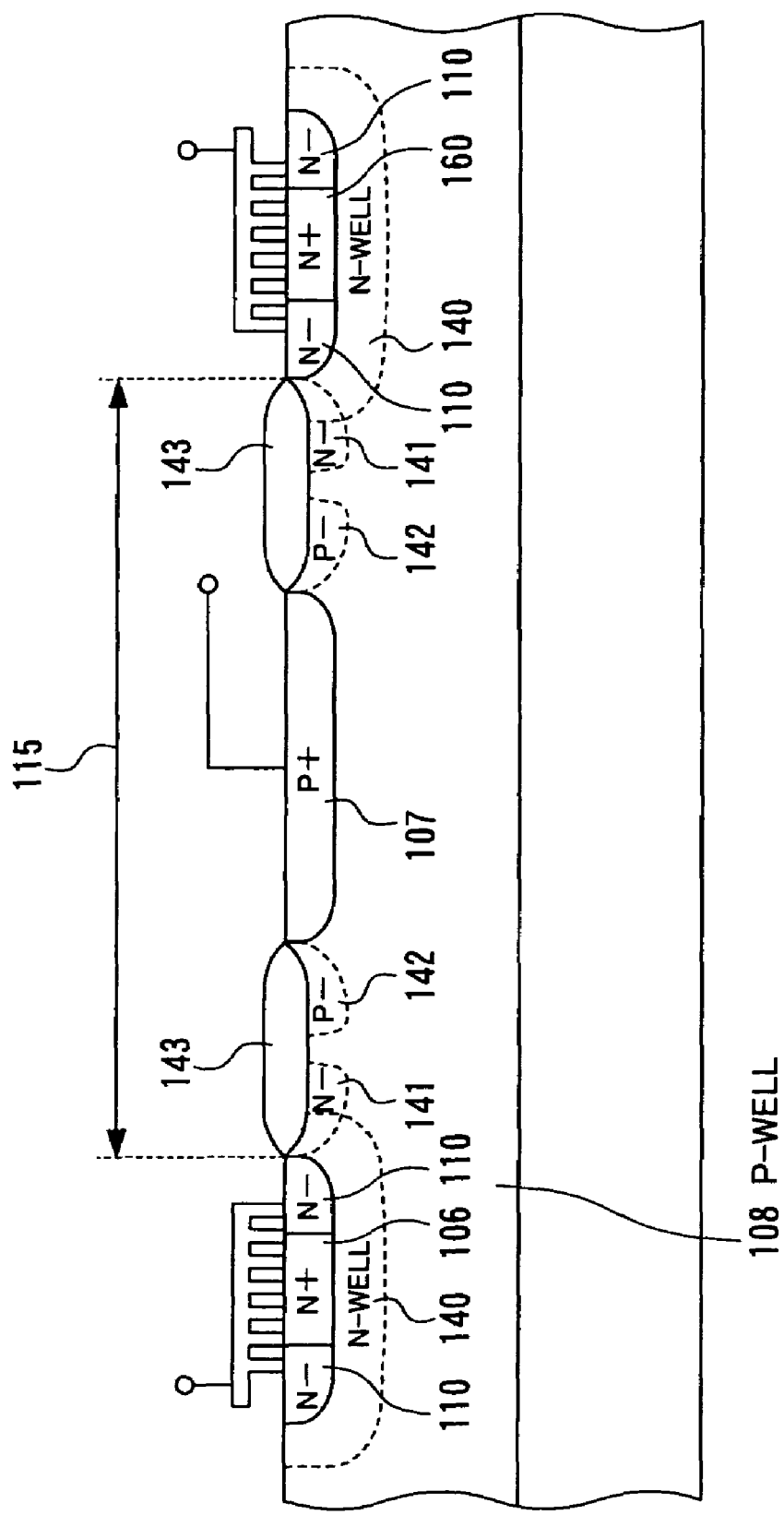
FIG. 5 is a cross-sectional diagram illustrating an exemplary design according to the second embodiment.
Figure 6:
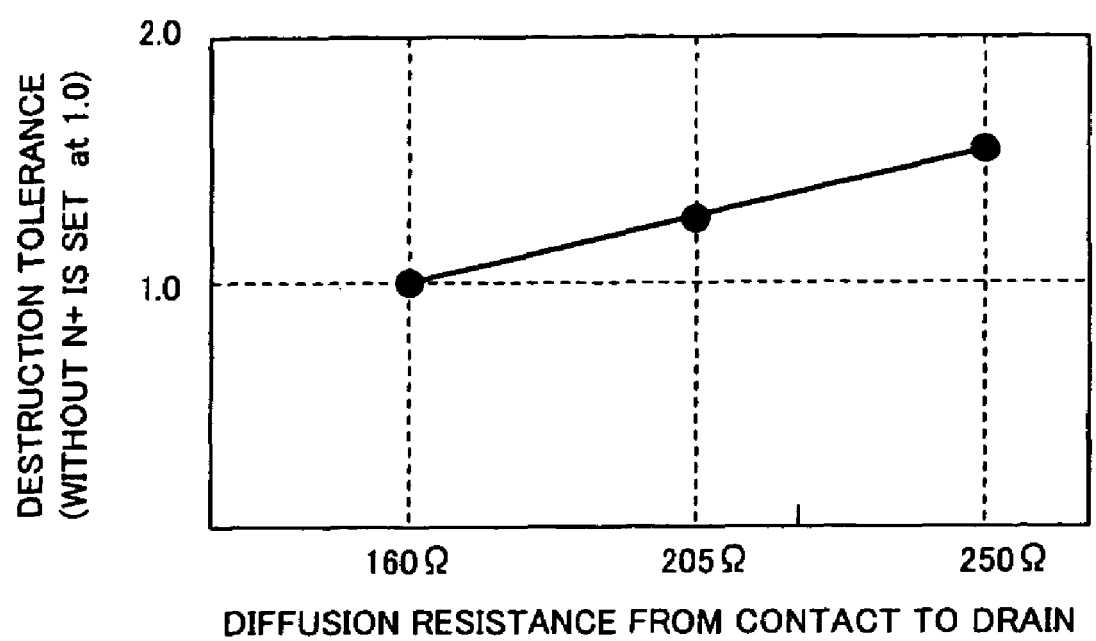
FIG. 6 is a diagram illustrating the result of evaluation of the destruction tolerance of the exemplary design of the second embodiment to destruction.

FIG. 5 is a cross-sectional structure diagram for explaining the design according to the second embodiment and FIG. 6 is a diagram for explaining the result of evaluation of destruction tolerance of the design according to the second embodiment.

A device will be described which includes a P-well 108 having a density of $2 \times 10^{15}$ Atoms/cm$^{-3}$, a density of N-well 140 for low voltage, having a density of $5.8 \times 10^{16}$ Atoms/cm$^{-3}$, a high-density N-diffusion layer 106 having a density of $5.0 \times 10^{20}$ Atoms/cm$^{-3}$, a high-density P-diffusion layer 107 having a density of $5.0 \times 10^{20}$ Atoms/cm$^{-3}$, a N-offset-diffusion layer 141 having a density of $3.0 \times 10^{16}$ Atoms/cm$^{-3}$, a P-offset diffusion layer 142 having a density of $5.0 \times 10^{16}$ Atoms/cm$^{-3}$. The distance across the isolation region 115 of the device is 54 μm.

When a potential of 80 V is supplied to the output terminal OUTn 104, a voltage of 0 V is supplied to the adjacent output terminal OUTn+1 105, and a noise pulse of a negative potential is inputted to the output terminal OUTn+1 105 to increase the noise level, the current of the NPN parasitic bipolar transistor exceeds a permissible limit, eventually resulting in a destruction.

FIG. 6 shows a comparison of the destruction tolerance of the device of the present invention obtained by changing the diffusion resistance in the portion from the output extracting aluminum electrode 144 to the drain end by changing the density of the low-density N-diffusion layer 110 formed in the drain region. It can be seen that the destruction tolerance increases as the diffusion resistance of the low-density N-diffusion layer 110 is increased.

As compared with the conventional design that includes a wider isolation region to improve the withstand voltage, the design of the present embodiment can keep the isolation region and therefore the chip size small while improving the noise tolerance of the transistor.

Third Embodiment

A driving circuit according to a third embodiment of the present invention will be described with reference to FIG. 7.

Figures 7A, 7B:
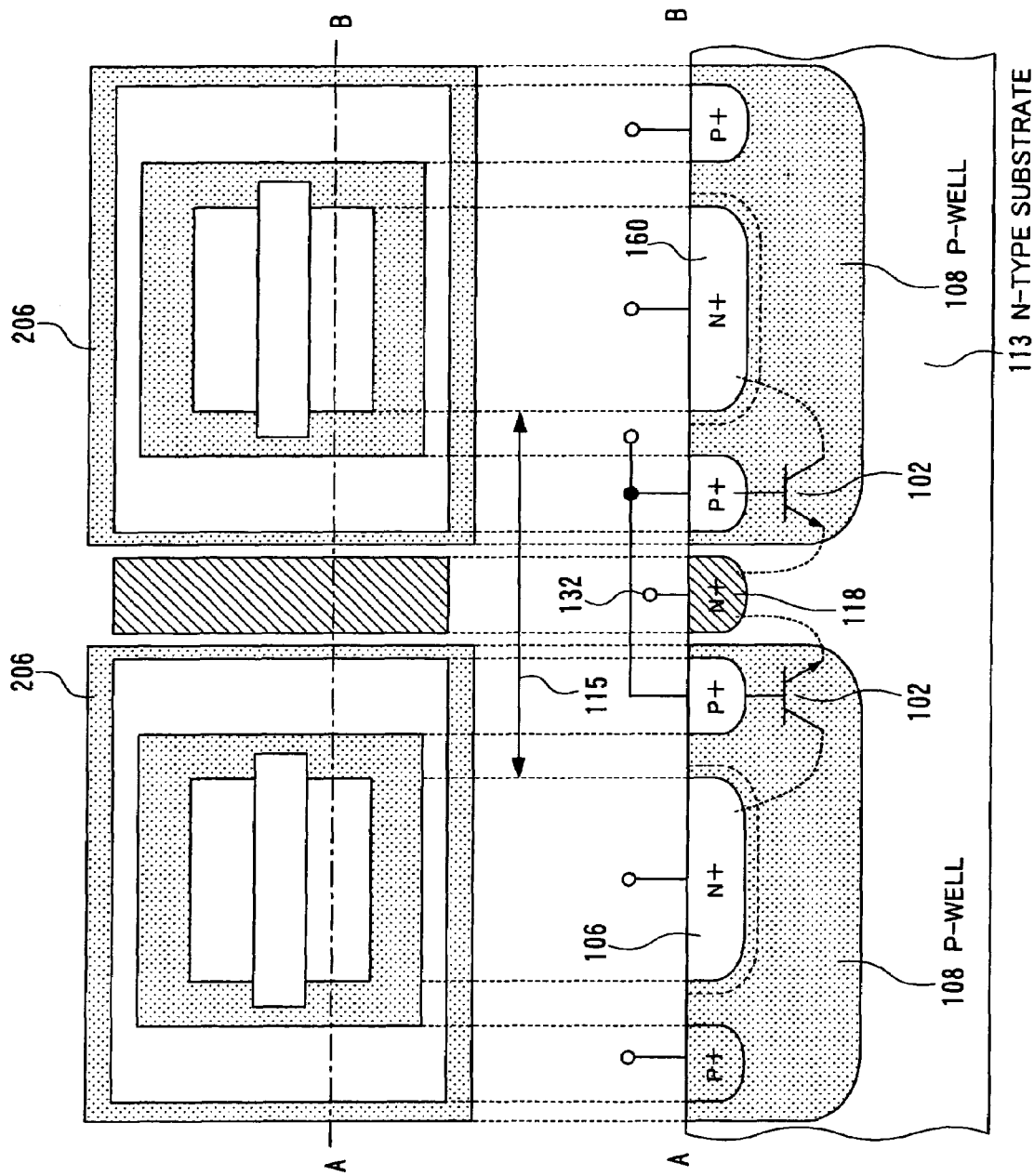
FIG. 7A is a schematic diagram showing a structure of a driving circuit for driving a PDP according to a third embodiment.
FIG. 7B is a schematic cross-sectional diagram of the driving circuit for driving a PDP according to the third embodiment.

FIG. 7A is a schematic diagram showing a structure of a driving circuit for driving a PDP according to the third embodiment and FIG. 7B is a schematic cross-sectional diagram of A-B section of the driving circuit for driving a PDP. The driving circuit of the third embodiment differs from that of the first embodiment in the substrate is an N-type substrate 113, each transistor is formed on a separate P-well 108, and the isolation region 115 of each transistor is formed by the N-type substrate 113 and an N-diffusion layer 118 for supplying a N-type substrate potential that can be fixed by an N-substrate potential supplying terminal 132 to a value higher than the built-in voltage between the N-type substrate 113 and the P-well 108.

Operation of the semiconductor circuit device will be described below.

As described in the section of "Background of the Invention", internal or external noise causes an NPN parasitic bipolar transistor formed between adjacent terminals to turn on to cause an abnormal current to flow, which results in a malfunction or destruction.

Because each of the adjacent transistors is formed on a separate P-well, the N-type diffusion layer 118 having a potential higher than the built-in voltage between the N-type substrate 113, which forms the drain and P-well 108, and the N-type substrate 113 are provided in the isolation region 115 as described above, the P-wells of the adjacent transistors are separated from each other. Accordingly, formation of an NPN parasitic bipolar transistor between the terminal of one transistor and the terminal of the adjacent transistor can be prevented. Thus, the tolerance against malfunctions and destruction can be improved and the tolerance to noise between the adjacent terminals can be improved by using a conventional CMOS process.

The isolation region 115 may be formed by N-substrate 113 only, without providing the N-type diffusion layer 118.

Fourth Embodiment

A semiconductor circuit device according to a fourth embodiment of the present invention will be described with reference to FIG. 8.

Figures 8A, 8B:
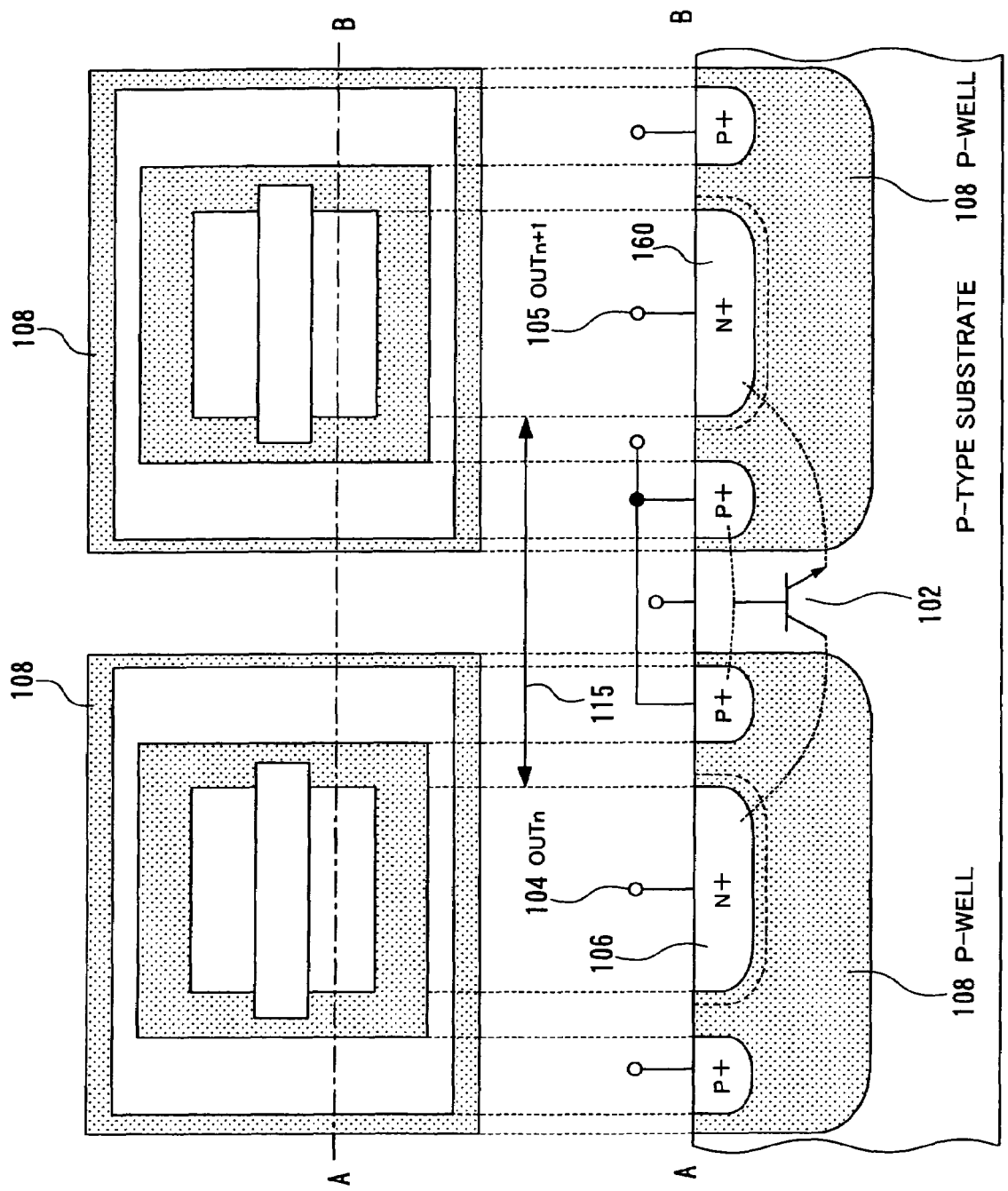
FIG. 8A is a schematic diagram showing a structure of a driving circuit for driving a PDP according to a fourth embodiment.
FIG. 8B is a schematic cross-sectional diagram of the driving circuit for driving a PDP according to the fourth embodiment.

FIG. 8A is a schematic diagram showing a structure of a driving circuit for driving a PDP according to the fourth embodiment and FIG. 8B is a schematic cross-sectional diagram of the driving circuit for driving a PDP according to the fourth embodiment, showing A-B section of the driving circuit. The driving circuit of the fourth embodiment differs from that of the first embodiment in that each transistor is formed on a separate P-well 108 and the isolation region 115 between adjacent transistors is provided in a P-type substrate 109 having a density lower than that of the P-wells 108.

Operation of the semiconductor device will be described below.

As described in the section of "Background of the Invention", internal or external noise causes an NPN parasitic bipolar transistor formed between adjacent terminals to turn on to cause an abnormal current to flow, which results in a malfunction or destruction.

Because the base region of an NPN parasitic bipolar transistor 102 is formed by the P-type substrate 109, a current flows from the output terminal OUT n 104 to the high-density N-diffusion layer 106 to the P-well 108 to the P-type substrate 109 to the P-well 108 to the high-density N-diffusion layer 160 to the terminal OUTn+1 105 when the NPN parasitic bipolar transistor 102 operates.

By providing the P-type substrate 109 having a density lower than that of the P-well 108 in the region that acts as the base of the NPN parasitic bipolar transistor 102 as described above, the collector current flowing through the high-density diffusion layer 106, which acts as the collector, can be reduced because the resistance of the P-type substrate 109 and therefore the base resistance is high. Thus, the tolerance to noise between adjacent terminals can be improved by using a conventional CMOS process.

Fifth Embodiment

A semiconductor circuit device according to a fifth embodiment will be described with reference to FIG. 9.

Figures 9A, 9B:
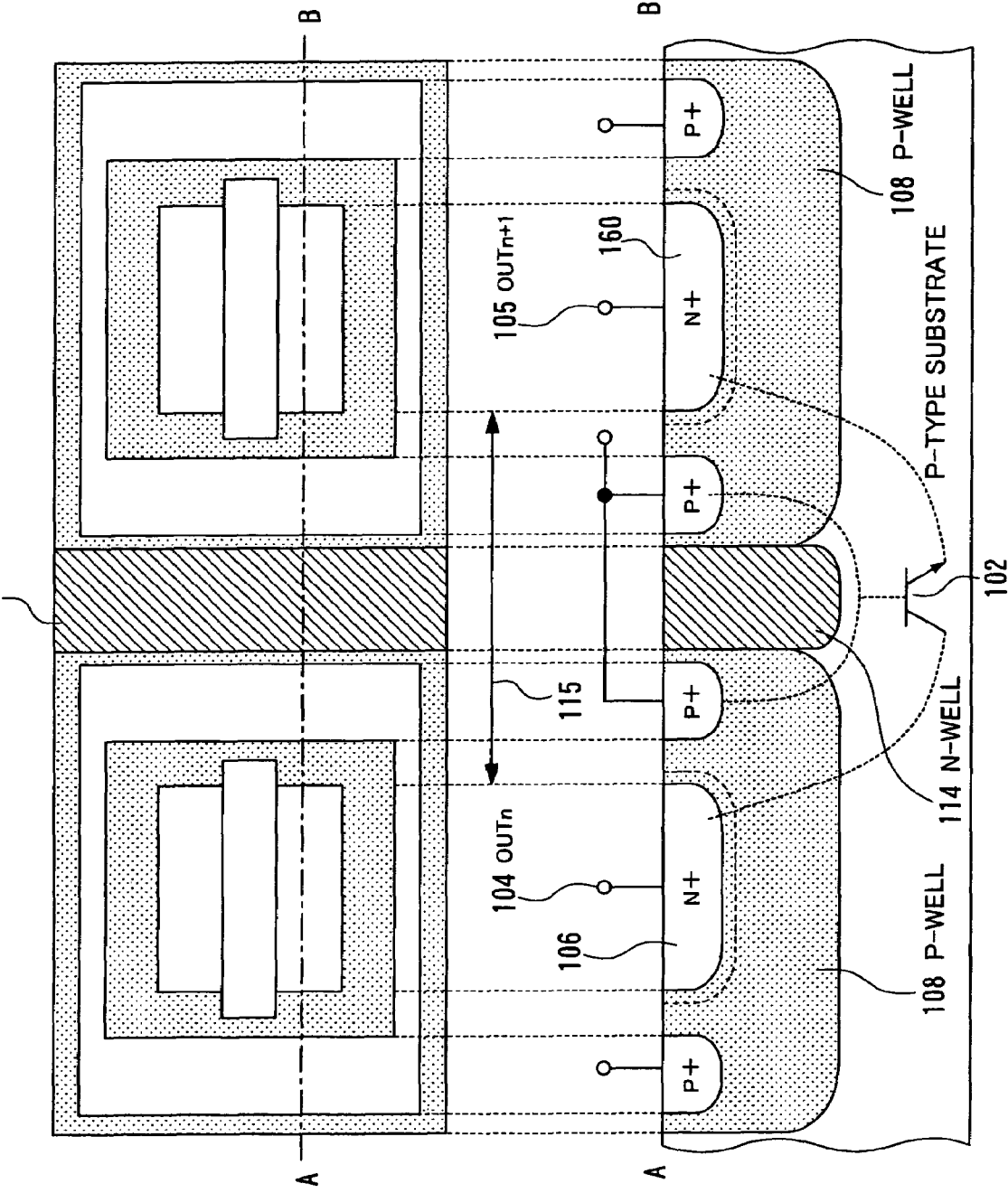
FIG. 9A is a schematic diagram showing a structure of a driving circuit for driving a PDP according to a fifth embodiment.
FIG. 9B is a schematic cross-sectional diagram of the driving circuit for driving a PDP according to the fifth embodiment.
Figure 10:
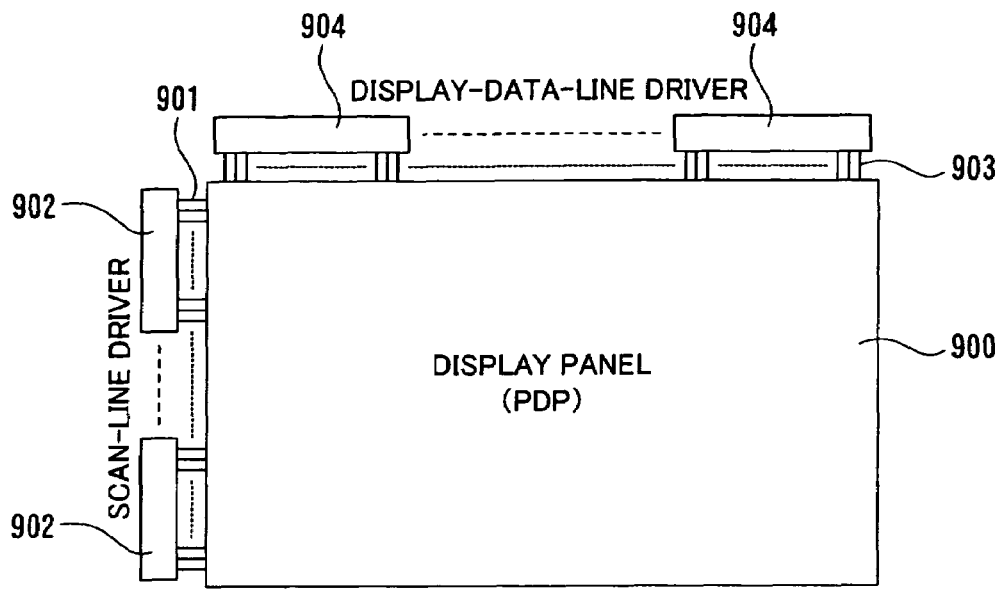
FIG. 10 is a schematic diagram of a typical plasma display panel.
Figure 11:
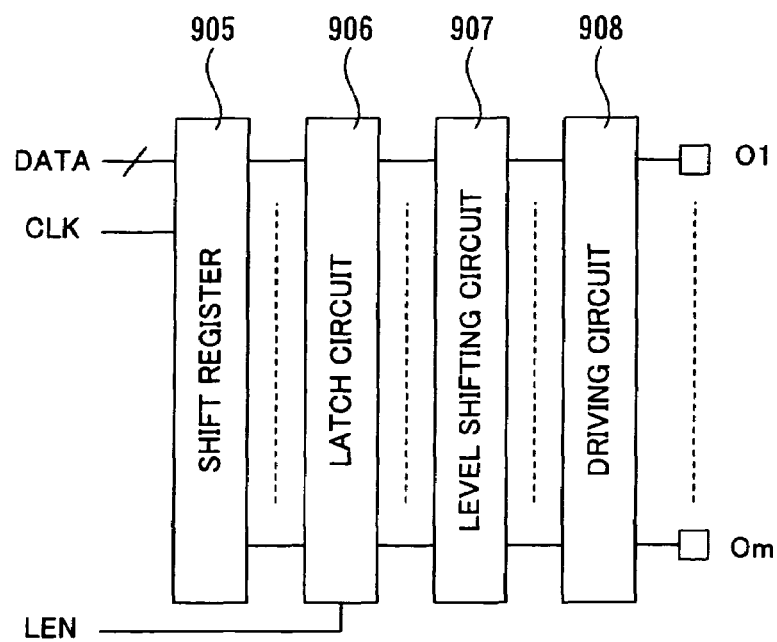
FIG. 11 is a block diagram of a conventional data-line driver for driving a PDP.
Figure 12:
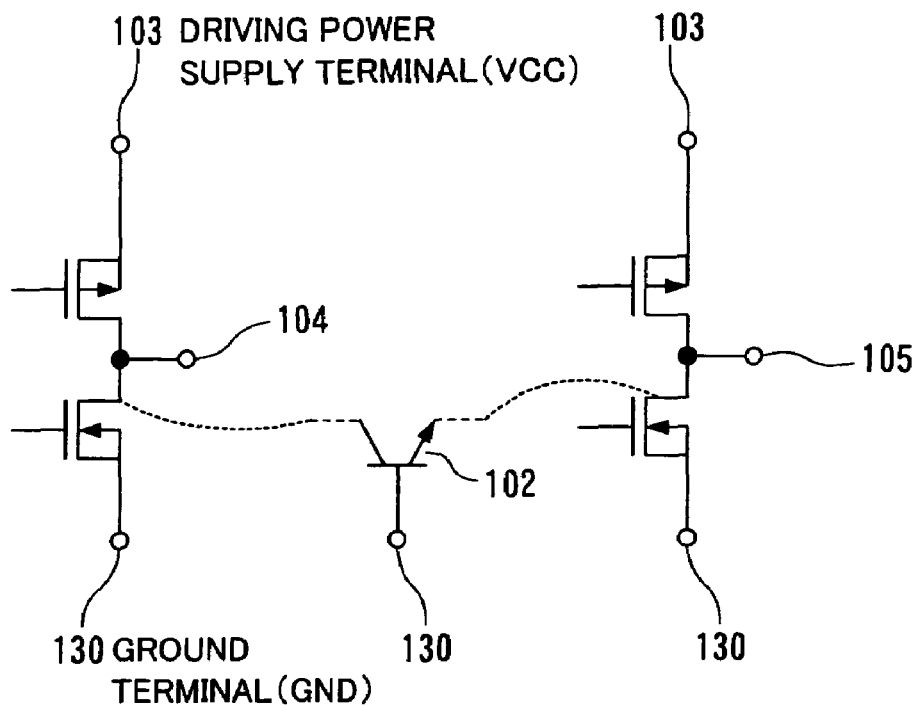
FIG. 12 is a circuit diagram of a conventional driving circuit.
Figure 13:
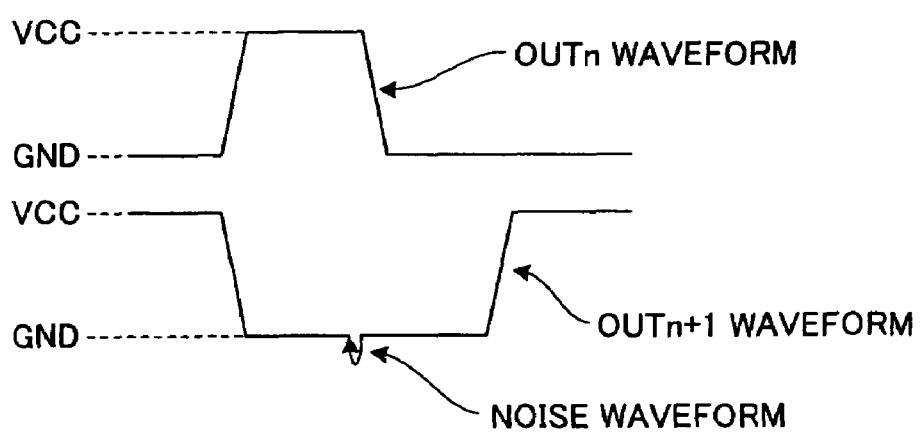
FIG. 13 is a driving waveform chart of the conventional driving circuit.
Figure 15:
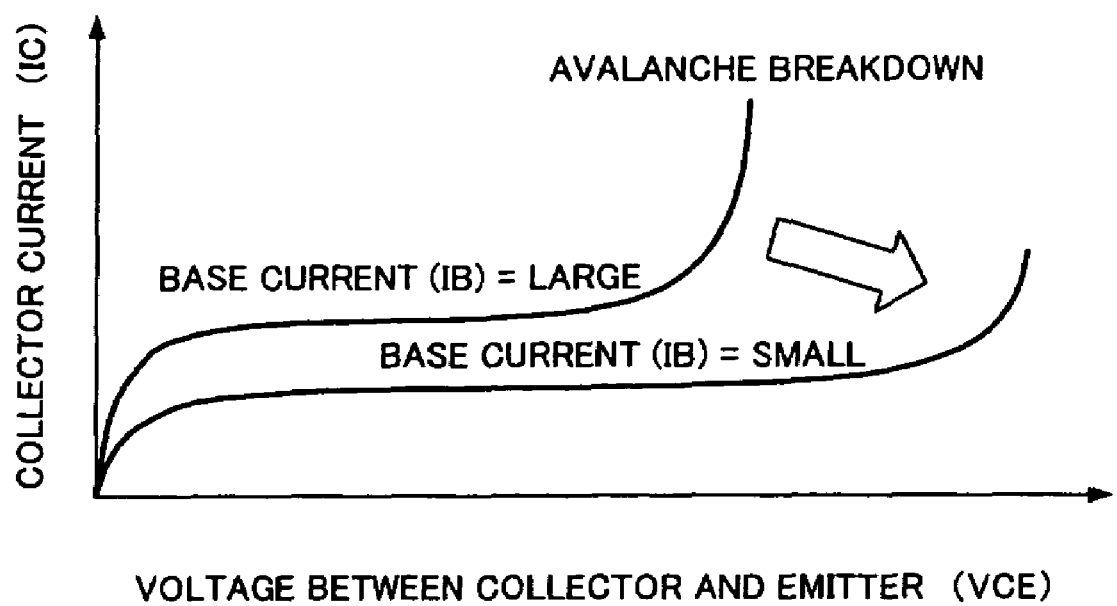
FIG. 15 is a diagram showing electric characteristics of an NPN parasitic bipolar transistor in the conventional driving circuit.

FIG. 9A is a schematic diagram showing a structure of a driving circuit for driving a PDP according to the fifth embodiment and FIG. 9B is a schematic cross-sectional diagram of the PDP-driving circuit according to the fifth embodiment, showing A-B section of the driving circuit. The driving circuit differs from that of the first embodiment in that each transistor is formed on a separated P-well 108 and an N-well 114 is formed in the isolation region 115 between adjacent transistors.

Operation of the semiconductor circuit device will be described below.

As described in the section of "Background of the Invention", internal or external noise causes an NPN parasitic bipolar transistor formed between adjacent terminals to turn on to cause an abnormal current to flow, which results in a malfunction or destruction.

Because the N-well 114 is formed in the base region of an NPN parasitic bipolar transistor 102, a current flows from the output terminal OUTn 104 to the high-density N-diffusion layer 106 to the P-well 108 to the P-type substrate 109 to the P-well 108 to the high-density N-diffusion layer 160 to the output terminal OUTn+1 105 when the NPN parasitic bipolar transistor 102 operates. Because the current path bypasses the N-well 114, the effective base length is increases and accordingly the base resistance becomes high. Therefore, the collector current flowing through the high-density diffusion layer 106, which acts as the collector, can be reduced.

As has been described, according to the fifth embodiment, the effective base length is increased by providing the N-well 114 in the base region of a parasitic NPN parasitic bipolar transistor. Accordingly, the base resistance is increased and collector current flowing through the NPN parasitic bipolar transistor can be minimized. Thus, the tolerance to noise between adjacent terminals can be improved by using a conventional CMOS process.

What is claimed is:

1. A driving circuit including a plurality of output terminals, comprising:
    a semiconductor substrate having a first conduction type;
    a first well having the first conduction type formed in the semiconductor substrate;
    a first diffusion layer having a second conduction type formed in the first well, the first diffusion layer related to a first output terminal of the plurality of output terminals;
    a second diffusion layer having the second conduction type formed in the first well, the second diffusion layer related to a second output terminal of the plurality of output terminals; and
    a third diffusion layer formed in the first well between the first diffusion layer and the second diffusion layer, the third diffusion layer including a fourth diffusion layer having the first conduction type, a fifth diffusion layer having the first conduction type, and a sixth diffusion layer having the second conduction type formed between the fourth diffusion layer and the fifth diffusion layer, wherein
    a voltage applied to the sixth diffusion layer is greater than a voltage applied to the first well.

2. The driving circuit of claim 1, wherein the first conduction type is a p-type and the second conduction type is an n-type.

* * * * *